(12) United States Patent
Zbinden

(10) Patent No.: US 12,716,919 B2
(45) Date of Patent: Aug. 25, 2026

(54) FIBER OPTIC CURRENT SENSOR CONTROLLER

(71) Applicant: Adam Jon Zbinden, Kenmore, WA (US)

(72) Inventor: Adam Jon Zbinden, Kenmore, WA (US)

(73) Assignee: OpticAmpere LLC, Kenmore, WA (US)

( * ) Notice: Subject to any disclaimer, the term of this patent is extended or adjusted under 35 U.S.C. 154(b) by 172 days.

(21) Appl. No.: 18/677,823

(22) Filed: May 29, 2024

(65) Prior Publication Data

US 2024/0369601 A1 Nov. 7, 2024

(51) Int. Cl.
*G01R 15/24* (2006.01)
*G02F 1/01* (2006.01)
*G02F 1/03* (2006.01)

(52) U.S. Cl.
CPC .......... *G01R 15/24* (2013.01); *G02F 1/0136* (2013.01); *G02F 1/0305* (2013.01)

(58) Field of Classification Search
CPC .... G01R 15/24; G01R 15/246; G01R 15/247; G02F 1/0136; G02F 1/0305
See application file for complete search history.

(56) References Cited

U.S. PATENT DOCUMENTS

2003/0075676 A1* 4/2003 Ruchet .................... G01J 4/02 250/225
2009/0273784 A1* 11/2009 Yamagaki ................ G01J 4/00 356/365
2025/0012832 A1* 1/2025 Ju ......................... G01R 15/22

* cited by examiner

*Primary Examiner* — Feba Pothen

(57) ABSTRACT

An optical fiber current sensing controller module, where an optical transmitter is energized from a DC source and emits an optical field of calibrated intensity and wavelength to a linear polarizer which generates a reference signal which is then launched in alignment with the transmission axes of a polarization maintaining optical fiber link to a remote and passive fiber optic current sensor (FOCS), where the linearly polarized optical pulse traverses a complete circular path around an energized conductor and is subject to polarization plane rotation in proportion to the magnetic flux density with the integration equal to electric current magnitude according to Ampere's law, and the rotated polarized optical pulse is transmitted back to the optical fiber current sensing controller module via a return fiber optic cable, where the Stokes vector polarization parameters for the returned optical signal are calculated by splitting the elliptically polarized field into four components, passing these components through an analyzer comprised of a linear horizontal polarizer, a linear vertical polarizer, a linear polarizer with transmission axis set at 45 degrees, and a linear polarizer with transmission axis set at 135 degrees, respectively, and where the four separate outputs of the four fiber optic polarizing filters are connected respectively to four separate photodiodes which transduce each optical intensity to analog voltage outputs which are sampled by a digital signal processing chipset, where the Stokes vector parameters for the polarized optical signal are calculated directly from the digitally sampled array of optical intensity values transduced by the photodiodes, and the change in polarization state from which electrical current is measured is derived by comparing the initial linear polarization Stokes vector of the generated reference signal with the measured Stokes parameters of the elliptically polarized optical signal received from the analyzer, and where a sample of the generated polarized reference signal is measured at a photodiode to monitor online sensor network optical attenuation and reference signal power fluctuations.

1 Claim, 1 Drawing Sheet

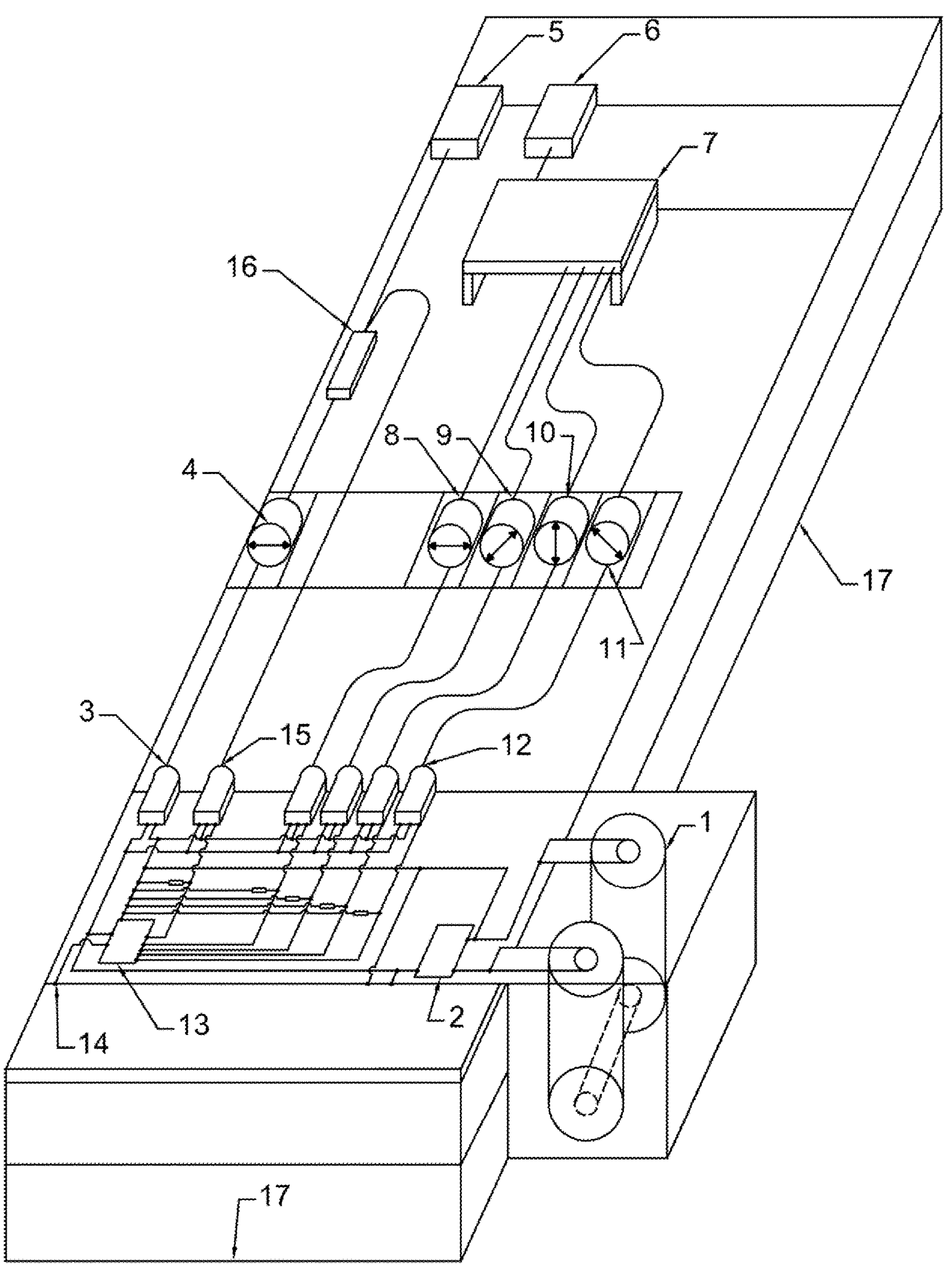
5
6
7
16
4
8
9
10
11
17
3
15
12
1
13
2
14
17

FIBER OPTIC CURRENT SENSOR CONTROLLER

BACKGROUND OF THE INVENTION

Electrical current sensing is of primary importance in power delivery system supervisory control and data acquisition systems, hereby referred to as SCADA.

Accurate real-time monitoring of current levels in a power delivery system is necessary for two primary reasons:

1) The monitoring of normal power flows for metering purposes.
2) The monitoring of abnormal current flows which occur during fault conditions, for protection purposes.

Conventional electromagnetic current transformers suffer from several disadvantages, due to their galvanic coupling with the electric circuit. Electrical current transformers operate based on the mutual induction between a primary coil and a secondary coil, with the turns-ratio between primary and secondary determining the level of current transformation, inverse to the voltage transformation, due to constant power constraints.

Current Transformer saturation occurs when the magnitude of the current- and associated magnetic flux which couples with the secondary coil of the CT-exceeds the finite number of magnetic domains available in the mass of the iron core. When this occurs, as the AC current travels through a positive or negative half wave cycle, all magnetic domains within the iron core will align in the same direction before the AC current signal reaches a maximum or minimum amplitude. At this point, the secondary current will not accurately reproduce the primary current.

For faults occurring in medium voltage enclosed switchgear and indoor substations, there are high levels of available fault current, but space constraints limit the size of CTs used and thus the magnetic core becomes a limiting factor for sensor range, and saturation can occur under fault conditions, leading to sub-optimal protection element operation and limited post-facto event analysis.

Optical CTs, which exploit Faraday rotation of linearly polarized light due to the presence of a magnetic field with a flux vector orientation which is longitudinally aligned and in parallel with the optical path when travelling within a waveguide transmission medium, can be used to measure electric current levels in a power distribution system, are galvanically isolated from the electrical system where current is being observed, and thus are immune to electrical fault failure modes. They also offer theoretically infinite bandwidth, as they do not use iron cores to store magnetic flux like conventional CTs. They also have a reduced mass and form factor for this reason. It is desirable to provide a means of integrating optical CTs into power delivery SCADA systems via a digital relay sensor module interface, where an optical CT can convert its measurements into a sampled value format for transmission to the data-processing and communications backplane of modern digital relays. This also offers the advantage of providing a DC power source for the optical CT sensor controller directly from the digital relay it is interfaced with, requiring no additional auxiliary power sources. In an alternative embodiment, the DC power source may be provided by a battery or other energy storage element, and the digitally processed, Stokes parameter based, current calculations can be transmitted directly to an integrated display screen, for applications requiring a portable ammeter, such as long-term load studies.

While a modularized embodiment may interface directly with the back plane of a relay or programmable logic controller system installed in low and medium voltage switchgear for power distribution systems, the present invention will find applications in similar technologies, such as service panel metering and electric vehicle charging station SCADA systems. In this case, the method of securing the fiber loop sensor around the service conductors of interest will be considered as a separate mechanical design problem which is subject to the mechanical constraints of the application, and therefor considered as a separate device with an input and output in the context of the present invention, and U.S. Pat. No. 11,175,315B2 is referenced as an example of a passive remote fiber loop current sensor which is mechanically adapted to interface with an overhead power distribution system and provide current monitoring of overhead power transmission and distribution lines.

The present invention is also applicable to direct current power systems, where the magnetic field polarity does not alternate during current transmission. In these systems, the use of induction-based current transformers is not possible, and the possibility of measuring direct current in cables or busway using optically isolated fiber optic current sensors is desirable. Examples of such direct current power systems include photovoltaic circuits and battery energy storage systems, where shunt resistor or Hall-effect sensors are the current state of the art for direct current sensing.

The present invention will also find application in partial discharge testing, where a fiber optic current sensor monitors high frequency current travelling to ground grid electrodes through a grounded cable shield or equipment ground connection, to detect the occurrence of partial discharge within cable or equipment insulation.

SUMMARY OF THE INVENTION

The present invention provides a means of interfacing between a passive, remote, distributed optical current sensor, and digital micro-processor relays. The module can generate an optical pulse of known wavelength, where the Verdet constant of the fiber sensing loop is wavelength dependent, and of known optical intensity, which is then polarized linearly, to create an optical output of known Stokes polarization parameters, by determining the Stokes vector of the module output as the product of the Mueller matrix of the polarizer and the output signal intensity, to create a known and standardized input reference value for the Stokes polarization parameters at the input of the passive remote current sensor, and where the linear polarization state is maintained between the sensor controller output and the remote, passive sensor assembly with a polarization-maintaining fiber link between ports.

The linearly polarized optical pulse, with known Stokes vector polarization parameters based on the Mueller matrix of the polarizer and the intensity of the pulse emitted by the transmitter, reaches an input of the remote passive fiber loop sensor, and traverses a complete circular path around an electrically energized conductor and experiences polarization state rotation due to the magnetic flux resulting from the electron flux of the current.

The polarized optical pulse having undergone Faraday rotation then travels back to the sensor controller input, via a return fiber optic cable link, and enters a signal division state, where the linearly polarized optical pulse is divided into four outputs with equally rationed signal power, as can be accomplished with a two-stage cascade of optical splitters or other optomechanical methods including a 1:4 splitter as utilized in FTTx networks, where the insertion loss of the component is corrected for in the optical intensity measurement variable.

The four optical outputs with equally rationed signal power are transmitted separately through a linear horizontal polarizer, a linear vertical polarizer, a linear polarizer with its transmission axis set at 45 degrees, and a quarter waveplate connected to a linear polarizer with transmission axis set at 45 degrees. This creates four separate analyzer channels with different polarization filtering characteristics: Linear horizontal, linear vertical, linear at 45 degrees, and right circular.

The four polarized outputs are transmitted orthogonally incident to photodetectors to transduce the optical intensity into electrical quantities.

The intensities of these four polarization states are then used to calculate the Stokes vector polarization parameters of the polarized optical pulse received at the sensor controller from the output of the remote passive fiber loop sensor in a data processing bus within the electro-optical current sensing controller module.

The Stokes vector polarization parameters of the received polarized light which are measured in this manner are compared with the known Stokes vector polarization parameters of the linearly polarized optical pulse input reference transmitted from the electro-optical current sensing controller module.

The difference in Stokes vector parameters characterizes the magnitude of Faraday rotation occurring in the remote fiber loop sensor, which directly correlates to magnetic field strength, and electron flux.

The transduced current data, in electrical form, is converted to a communications protocol which is compatible with the digital relay format and is transmitted to the data-processing and communications back plane of the digital relay for further utilization within the power system SCADA network.

DESCRIPTION OF THE FIGURES

FIG. 1 depicts the present invention where 1 is a DC electrical source connected to input power bus 2 which connects to photodetectors 12,15 and digital signal processing chipset 13 while powering the optical source 3, which transmits light to a polarizing fiber optic cable 4 which connects to output port 5 with an intermediate coupler 16 providing an online optical reference source feedback monitor at photodetector 15, while returned pulses enter input port 6 which connects to a 1:4 coupler 7 which divides the optical field into four components of equal intensity while maintaining polarization across a monolithic output transmission axes alignment at the four coupler outputs where a polarizing fiber optic cable 8 is spliced with transmission axis in horizontal alignment at 0°, a polarizing fiber optic cable 9 is spliced with transmission axis aligned at 45°, a polarizing fiber optic cable is spliced with transmission axis aligned at 90° at 10, and a fourth polarizing fiber optic cable is spliced with transmission axis aligned at 135° at 11, where the transmission axis alignment of polarizing fiber optic cables 8,9,10,11 is defined with respect to the monolithic polarization axes of the outputs of 1:4 coupler 7, where the polarized outputs of 8,9,10,11 are connected to a photodetector array 12 which transduces the optical intensity to analog voltage outputs which are sampled by the analog to digital conversion card inputs of the digital signal processing chipset 13 which displays data on an integrated display screen 14 and where all components noted are encased within environmentally rated protective module housing 17.

DETAILED DESCRIPTION OF THE INVENTION

When linearly polarized light traveling in a waveguide transmission medium undergoes Faraday rotation in the presence of a magnetic field, the polarization state changes.

To measure the change, the Stokes polarization parameters, which completely describe the polarization state of light, are compared before and after traversing the passive fiber loop current sensor assembly, where the Stokes parameters(S) are defined in vector form as:

$$S = \begin{pmatrix} S_0 \\ S_1 \\ S_2 \\ S_3 \end{pmatrix} \quad \text{Eq. 1}$$

Where $S_0$ is the overall intensity of the optical field generated by the polarized light pulse, $S_1$ is defined as the amount by which the intensity value of linearly horizontal polarized light exceeds the intensity value of linearly vertical polarized light present in the optical pulse, $S_2$ is the amount by which the intensity value of linearly positive 45 degree polarized light exceeds the intensity value of the linearly negative 45 degree polarized light, and $S_3$ is defined as the amount by which the intensity value of the right circularly polarized light exceeds the intensity value of the left circularly polarized light.

The passive remote sensor assembly input polarization state is linear, and the Stokes polarization vector for this reference input is calculated from the product of the optical signal intensity generated by the transmitter and the Mueller matrix of the linear polarizer, modulated by the amplitude transmission coefficient of the polarizer.

For a transmitter emitting unpolarized optical pulses, the Stokes vector is initially a known value, and the relation between the overall intensity of an optical pulse, as a function of polarization rotation state and phase displacement angle, and the four Stokes parameter observable intensity quantities, is expressed with the Stokes Intensity Equation as:

$$I(\theta, \varphi) = \frac{1}{2}[S_0 + S_1\cos 2\theta + S_2\cos\varphi\sin 2\theta - S_3\sin\varphi\sin 2\theta] \quad \text{Eq. 2}$$

The Stokes vector parameters for a linear horizontal polarization reference input which is transmitted to the remote fiber loop sensor are then calculated with:

$$\begin{pmatrix} S_0' \\ S_1' \\ S_2' \\ S_3' \end{pmatrix} = \frac{\rho_x^2}{2}(S_0 + S_1)\begin{pmatrix} 1 \\ 1 \\ 0 \\ 0 \end{pmatrix} \quad \text{Eq. 3}$$

Where ρ is the amplitude transmission coefficient and is equal to 1 in an ideal polarizer, and $S_0$ and $S_1$ are known based on the output intensity of the unpolarized light source.

For a linear vertical polarization reference input, the Stokes vector describing the polarization parameters for the fiber loop sensor reference input value are found with:

$$\begin{pmatrix} S_0' \\ S_1' \\ S_2' \\ S_3' \end{pmatrix} = \frac{\rho_y^2}{2}(S_0 - S_1)\begin{pmatrix} 1 \\ -1 \\ 0 \\ 0 \end{pmatrix} \quad \text{Eq. 4}$$

Where ρ is the amplitude transmission coefficient and is equal to 1 in an ideal polarizer, and $S_0$ and $S_1$ are known based on the output intensity of the unpolarized light source.

The device then transmits linearly polarized optical pulses of known Stokes polarization parameters and is then configured to align with the transmission axes of polarization maintaining fiber at a PM launch coupling output, such that the optical fiber link between the sensor module output and the passive remote optic fiber loop sensor assembly input preserves the polarization state of the optical pulse injected to the input of the passive fiber loop current sensor assembly.

The optical pulse input to the remote passive sensor assembly in this manner then traverses a circular loop around an energized electrical conductor and returns to the sensor module input on a fiber link of negligible polarization mode dispersion, to negate pulse separation between the orthogonally polarized modes travelling from the passive fiber loop current sensor assembly to the sensing controller module input, and subsequent pulse-splitting stage, where the polarized optical pulse received from the remote fiber loop sensor is split in an equal 1:4 ratio, and the optical sub-components routed to four separate outputs.

The four optical outputs of the signal-division stage pass through polarizing elements again, before an orthogonally incident optoelectronic detector measures the intensity of each polarized optical output separately, in a quadrature array fashion, where the Stokes intensity equation implies an online optical calculator architecture for solving said equation using observable intensity values.

A first quarter of the divided signal passes through a linear horizontal polarizer before reaching an optoelectronic detector to measure signal intensity, which is equal to:

$$I(0, 0) = \frac{1}{2}(S_0 + S_1) \quad \text{Eq. 5}$$

A second quarter of the divided signal passes through a linear vertical polarizer before reaching an optoelectronic detector to measure signal intensity, which is equal to:

$$I\left(\frac{\pi}{2}, 0\right) = \frac{1}{2}(S_0 - S_1) \quad \text{Eq. 6}$$

A third quarter of the divided signal passes through a linear polarizer with a transmission axis aligned at 45° before reaching an optoelectronic detector to measure signal intensity, which is equal to:

$$I\left(\frac{\pi}{4}, 0\right) = \frac{1}{2}(S_0 + S_2) \quad \text{Eq. 7}$$

A fourth quarter of the divided signal passes through a right circular polarizer, comprised of a quarter waveplate connected to a linear polarizer with a transmission axis aligned at 45° before reaching an optoelectronic detector to measure signal intensity, which is equal to:

$$I\left(\frac{\pi}{4}, \frac{\pi}{2}\right) = \frac{1}{2}(S_0 - S_3) \quad \text{Eq. 8}$$

And the Stokes vector polarization parameters are obtained as:

$$S_0 = I(0, 0) + I\left(\frac{\pi}{2}, 0\right) \quad \text{Eq. 9}$$

$$S_1 = I(0, 0) - I\left(\frac{\pi}{2}, 0\right) \quad \text{Eq. 10}$$

$$S_2 = 2I\left(\frac{\pi}{4}, 0\right) - S_0 \quad \text{Eq. 11}$$

$$S_3 = S_0 - 2I\left(\frac{\pi}{4}, \frac{\pi}{2}\right) \quad \text{Eq. 12}$$

The Stokes Vector polarization parameters found with Eqn 9-Eqn 12 are compared with the Stokes vector linear horizontal and linear vertical polarization state reference inputs to the passive sensor assembly, in Eqn 3 and Eqn 4.

The Δθ polarization state change experienced by the linearly polarized photon pulse traversing the passive fiber loop current sensor assembly is directly proportional to the strength of the magnetic field, β, based on Faraday rotation:

$$\theta = V\beta l \quad \text{Eq. 13}$$

Where V is the Verdet constant of the optical transmission medium of the fiber sensor and expresses the sensitivity to rotation in $$\frac{\text{rad}}{T * m},$$

where the polarization state will rotate a certain amount of radians for a given magnetic flux density in Tesla which varies inversely with the distance from the magnetic field, and L is the effective path length traveled by the photon within the magnetic field.

The magnetic field strength, β, is then directly proportional to electrical current based on Ampere's Law:

$$\oint \vec{\beta} * \vec{dr} = \mu_0 I_{Encircled} \quad \text{Eq. 14}$$

Variations in the circular birefringence of the fiber optic sensor coil which surrounds an electrical conductor, which are induced by the magnetic field with flux density B, and which transduce the linear polar Faraday rotation occurring when the polarized photons sent by the interrogator comprised of the present invention traverse the closed loop path of the FOCS waveguide are calculated with the orientation angle ψ and ellipticity angle χ of the polarization ellipse:

$$\tan 2\psi = \frac{S_2}{S_1} \quad \text{Eqn 15}$$

Where the orientation angle ψ measures the linear polarization rotation angle after conversion to Cartesian coordinates with the Poincare sphere.

And where variations in the linear birefringence of the waveguide, which correspond to mechanical or acoustical disturbances to the fiber optic sensor network altering the phase delay between orthogonal components, are observed with the ellipticity angle $\chi$ using the coordinate conversions enabled by the Poincare sphere:

$$\sin 2_{\chi} = \frac{S_3}{S_0} \quad \text{Eqn 16}$$

And with Eqn 15 and Eqn 16 the Stokes parameters derived from Eqn 9-Eqn 12 have inherent noise immunity when observing changes in linear Faraday rotation which directly transduces electrical current and variations in the phase delay between the orthogonally polarized field components which alters the polarized photon's ellipticity.

The four-way pulse division can be accomplished with a 1:4 FTTx signal splitter, where insertion losses are factored into the intensity state variable.

For the optical transmission network, the attenuation of the launch and receive cables which connect to the input and output ports of the electro-optical current sensing controller module, is a function of distance, and while polarization maintaining fiber links the optical current sensor controller module output and passive fiber loop current sensor assembly input so as to preserve the polarization parameters required for a stable linear polarization input state reference, which is required to calculate the change in polarization state resulting from the optical pulse traversing the fiber loop sensor assembly in the presence of the magnetic flux surrounding the electrically energized conductor, it is necessary to compensate for the distance attenuation, expressed in dB/km, of the launch cable. Absorption losses of components and connection losses are assumed to be measurable or known, such that the optical attenuation of the entire network on the transmit side which connects the electro-optical sensing controller module output to the passive fiber loop current sensor assembly input, and on the receive side, which connects the passive fiber loop current sensor assembly output to the electro-optical current sensing controller module input, can be accounted for and compensated in the measured intensity values.

As maintaining a stable reference input polarization state seen at the distributed fiber loop sensor is critical for accurate $\Delta\theta$ polarization parameter measurements, the signal attenuation, in dB/Km, of the polarization maintaining launch cable which links the optical sensor controller transmitter output with the input of the remote, passive fiber loop sensor must be factored into the real signal intensity power level seen at the remote fiber sensor, and this actual value which accounts for the distance-based loss is subtracted from the transmitter output to estimate the true intensity value seen at the fiber loop sensor input when calculating the reference input Stokes vector polarization parameters.

The return fiber transmission cable which links the remote fiber loop sensor output with the optical current sensor controller input is required to have minimal polarization mode dispersion, to preserve the polarization state of optical pulses transmitted from the fiber loop sensor output, and the known distance-attenuation properties of the return fiber cable can be used to compensate for transmission and insertion losses in the optical sensing network.

The total optical power attenuation in the sensor controller and distributed fiber loop sensor network can be theoretically calculated based on the insertion loss values of all internal components and the length of the fiber optic launch and receive cables which link the sensor controller to the remote fiber sensor, and the intensity values used for Stokes vector polarization parameters are compensated accordingly, where the attenuation experienced by the optical signal pulse travelling from the controller module to the fiber loop sensor is subtracted from the initial reference input for linear polarization state based on known transmitter output intensity, while the attenuation of signal power, whether due to insertion losses, or distance, which occurs in the optical pulse as it travels from the remote fiber loop current sensor output to the optical current sensor controller module input is added to the to the intensity of the received optical pulse for compensation in the Stokes vector polarization parameter calculations.

In the present invention, the DC input bus may be energized from a DC battery source, and the Stokes vector parameter calculations obtained from the received detector intensities and resulting polarization rotation current calculations may be routed from the digital outputs of the digital signal processing bus directly to an integrated display screen on the fiber optic current sensor controller module, for portable ammeter and mobile power quality survey applications or remote control cabinet installations where external DC power is not available.

The polarization control of the photonic circuit may be accomplished with flexible single mode fiber optic cables with in-line all fiber polarizing elements featuring a transmission axis with a high extinction ratio, where birefringent axes are rotated within the single-mode fiber with mechanical force, and micro pressure induces controllable phase retardance, to create stress-induced birefringence of controlled rotation angle based on the physical rotation of the slow and fast axes within the fiber, which is acting as a polarizing waveplate in proportion to applied pressure, in the case of a circular polarization output, wherein the four Stoke's parameters are calculated by measuring the intensity of the rotated polarized optical pulse at the four observable conditions of polarization rotation angle and phase delay required to completely solve the Stoke's intensity equation for all four observable intensity parameters which when superimposed completely characterize the state of optical polarization.

The ability to simultaneously measure all four Stoke's parameters for a single optical pulse and solve the intensity equation with superposition is due to pulse splitting, where the optical pulse's modal field power distributes equally to four different output channels, at which point the polarization control and filtering required to perform classical Stoke's parameter characterization by measuring the intensity of the sampled light being analyzed at the four polarization rotation and phase delay conditions necessary to completely solve the Stoke's intensity equation for all four Stoke's observable parameters, and the ability to quantify the intensity, with both high resolution and numerical precision, using solid state photoreceivers, which can provide an output diode current which is proportional to the received optical intensity, enables precise relative current fluctuation measurements to be recorded with high sampling frequency.

The use of flexible fiber components with mechanically induced birefringence and calibrated polarization transmission axis rotation angle, to perform polarization control in the photonic measurement circuit, may be useful in the embodiment of the present invention where a portable current sensing module enables mobile current sensing of energized conductors for ammeter applications in the field, where an advantage of said invention embodiment over existing portable sensing methods in the art field of portable ammeters is the extended optical launch and receive patch cords which interface between a fiber loop sensor which surrounds an electrically energized conductor, and the optical current sensing module being held by a user, where said patch cables allow a user to stand remote from an energized conductor being surveyed optically for current data at a distance which is compliant with arc flash incident energy safety requirements.

Although obvious to one skilled in the art, a tuning method for the polarization states of the four Stokes intensity measurement channels is to attach a variable rotatable polarizer to the output of a transmitter, such that horizontal, 45 degree, and vertical polarization states are transmitted through the fiber polarizing element being tuned, and a polarimeter is attached on the receiving end to verify the intended polarization state, in Poincare sphere coordinates or Stokes parameters. Alternatively crossed polarizers and null intensity based on the law of Malus may be used to calibrate the splice angles for the in-line fiber polarizers using extinction ratio measurements. In this case the transmission axis is rotated relative to the fixed PM fiber axes it is being aligned with, until the null intensity is achieved at a 90 degree perpendicular null intensity point. While full power transmission occurs when the transmission axis is aligned with the calibration input linear polarization axis and half power occurs at 45 degrees, respectively, as verified by a light source and power meter connected to an input and output of a birefringent PM fiber core being aligned with the transmission axis of a birefringent polarizing fiber core prior to fusion splicing to achieve a desired polarization state at the output as verified by the power meter during fiber core axis rotation.

It is also obvious to one skilled in the art that digital finite impulse response filters can be used for further digital signal conditioning of the optical intensity signals, and discrete Fourier transforms can be used for spectral and harmonic analysis.

Variations in the observed magnitude of $S_1$ and $S_2$ (the preponderance of linear horizontal polarized light over linear vertical polarized light, and +45° linear polarized light over −45° linear polarized light, respectively) provide complete information corresponding to optical axis polarization rotation of a linearly- or elliptically-polarized optical pulse, and therefor $S_1$ and $S_2$ exclusively transduce the circular birefringence induced by an external magnetic field, in the best mode embodiment of the present invention, while the parameter $S_3$ (the preponderance of right circular polarized light over left circular polarized light) expresses the degree of phase separation between the two orthogonally polarized modes, and therefor exclusively transduces the linear birefringence which would be introduced by vibration or other mechanical disturbances in a fiber sensing network, which modulates the degree of major axis rotation occurring during Faraday rotation. Therefor the separation of the parameter $S_3$ from $S_1$ and $S_2$ (with all intensity measurement variations calculated relative to So, the overall optical signal intensity of the current-sensing optical pulse) enables inherent separation of the circular birefringence experienced by the current-transducing polarized optical pulses in the presence of a magnetic field which surrounds an energized electrical conductor, from the linear birefringence which results from vibration or mechanical disturbance to the sensing fiber network, which produces phase delay between the orthogonally polarized field components, therefor creating an elliptical polarization state, which can be plotted in terms of the Poincare sphere or polarization ellipse using the observed Stokes parameters measured with the present invention.

For this reason, it will also be obvious to one skilled in the art of fiber optic networks that the present invention will also find application in distributed acoustic sensing, such as for intrusion detection perimeters, where the mechanical-acoustical pressure waves of environmental movement are transduced in the fiber optic waveguide as variations in linear birefringence, and therefor a proportionate phase delay and a varying elliptical polarization state is observed at the receiver, relative to an input reference polarization state. This is a novel alternative to the existing method of DAS which is based on backscatter analysis.

In this alternative distributed acoustic sensing embodiment, the device may serve to interrogate a DAS sensor such as U.S. Pat. No. 11,543,444, in addition to interrogating magnetic field and electrical current sensors such as U.S. Pat. No. 11,175,315. Where $S_3$ expresses variations in linear birefringence along a sensing line, such as introduced by the transverse mechanical pressure exerted on a DAS sensor line by U.S. Pat. No. 11,543,444 which monitors changes in the static loading and bending movement of utility poles caused by broken conductors, where the device of U.S. Pat. No. 11,543,444 exerts a linear pressure on the sensing line in response to a pole moment shift which acts as a wave plate introducing linear birefringence and phase delay between two orthogonally polarized optical pulses traversing the sensing line, and the location is inferred based on the degree of phase separation observed at a receiver, or variations in the ellipsometry observed from the Stoke's parameters, which is naturally dependent on the linear birefringence of the fiber optic waveguide.

Using the present invention as an electrical current sensor, when monitoring Stokes intensity parameter $S_1$ and $S_2$ for circular birefringence variation, and as a polarimetric DAS sensor, when monitoring Stokes intensity parameter $S_3$ for the linear birefringence variation, provides inherent noise-cancelling ability for mechanical vibration effects on the fiber optic current sensing (FOCS) network.

It will be obvious to one skilled in the art that the solid state optical emitting light source 3 may be comprised of a single-mode laser, with polarizing transmission axis aligned with the polarizing axis of the output reference polarizer 4, where optical source 3 is of suitable wavelength and power level required for sensor network sensitivity.

The photo-detecting module 12 may be comprised of an integrated OEM component, with integrated small-signal filtering and DC-modulation, for noise-reduction and amplification, where 12 is enclosed in a sealed module with analog electrical I/O connections, and the analog electrical DC voltage signal outputs of 12 may connect directly via soldered PCB board interface connections to the integrated singled-ended analog-to-digital inputs of a digital signal processing integrated chipset 13, which interfaces directly with MATLAB or other engineering software via an HMI user interface, as shown with 14.

In this configuration, the device may be used as a research instrument, for power system studies and analyzing fault current dynamics, where optical current sensors have superior bandwidth to their electromagnetic sensing counterparts. Alternatively, the digital signal processor chipset 13, with integrated single-ended analog to digital conversion inputs, which transduce the analog current signal outputs of photo-diode 12 which are converted to voltage signals by load resistors, can be recorded or viewed in real time for calculation, analysis, visualization, or programming, using the optically-transduced electrical current data which the present invention provides, by deploying an online calculation algorithm for current, which separates the linear birefringence from the circular birefringence induced by the magnetic flux incident a fiber optic current loop sensor, and where a laboratory-based calibration curve, relating the major axis rotation observed in the state of polarization to magnetic flux levels, and corresponding current magnitude, is used to output an electrical current value to integrated display screen 14, in the portable field-based embodiment of the device. This algorithm is developed offline using training data and then programmed into the digital signal processor chipset 13 to perform the calculations online using integrated digital outputs on the chipset connected to the HMI screen of the device.

It will also be obvious to one skilled in the art that the modularized and encased embodiments of the present invention will require environmental protection from vibration, moisture, shock, electro-static (ESD) discharge, or other physical stressors which would damage the electro optical components which comprise the present invention. It is obvious that all fiber optic polarizing elements may be packaged in coils, while fiber optical signal dividing components 7, whether fused biconic taper (FBT) or planar light wave (PLC) silicon photonic bridge chip, and other components in the fiber optic waveguide network of the present invention will require insulation and secure mechanical installation to prevent damage or internal movement within the device.

The scope of the present invention, as an electrical power systems current sensor and magnetic field characterization device, pertains only to earth-grounded power systems, where all sources, nodes, or devices under test (DUT) may be considered as referenced to earth-electrode ground potential, for system reference voltage ground potential calculation purposes, and all potential electrical fault current has an available low impedance conduction path to an earth-potential ground grid, comprised of one or more grounded electrodes, for power systems calculations and analysis using data transduced with the present invention.

Although the present invention teaches a polarimetric fiber optic current sensor interrogator which is capable of measuring linear polarization rotation angle, corresponding to Faraday rotation, in a way that is noise-immune within a 2× phase stability margin, after which polarization mode dispersion would cause pulse separation and interfere with online SOP determination required for current measurements, where the observed intensities are directly related to the polarization rotation angle, θ, and phase delay, q, and where the former quantity is transduced exclusively by $S_1$ and $S_2$ within the phase stability margins observed on $S_3$, it is obvious that these underlying system dynamics can be learned by a pattern recognition neural network or machine learning algorithm, such that while the mathematical relations between the Stokes parameters and the polarization ellipse are required to understand the system dynamics, in a preferred embodiment a machine learning algorithm may be trained to learn and recognize these ellipsometry dynamics to perform online current calculations with artificial intelligence.

The Mueller Matrix for the circular polarizer is found by multiplying the Mueller matrix for the 45 degree linear polarizer with the Mueller matrix of the quarter waveplate which follows, noting the matrices are not inherently commutative and the order in which the light pulse encounters polarizing elements is the order in which the respective Mueller matrix multiplication is performed, where the polarization filtering characteristics of the circular polarizer, in circular configuration, are found with $$M_{Circular\ Polarizer-Circular} = M_{\varphi}M_{\theta} = \begin{pmatrix} 1 & 0 & 0 & 0 \\ 0 & 1 & 0 & 0 \\ 0 & 0 & 0 & -1 \\ 0 & 0 & 1 & 0 \end{pmatrix} * \begin{pmatrix} 1 & 0 & -1 & 0 \\ 0 & 0 & 0 & 0 \\ -1 & 0 & 1 & 0 \\ 0 & 0 & 0 & 0 \end{pmatrix} = \begin{pmatrix} 1 & 0 & -1 & 0 \\ 0 & 0 & 0 & 0 \\ 0 & 0 & 0 & 0 \\ -1 & 0 & 1 & 0 \end{pmatrix} \frac{1}{2} * \begin{pmatrix} 1 & 0 & -1 & 0 \\ 0 & 0 & 0 & 0 \\ 0 & 0 & 0 & 0 \\ -1 & 0 & 1 & 0 \end{pmatrix} * \begin{pmatrix} S_0 \\ S_1 \\ S_2 \\ S_3 \end{pmatrix} = \frac{1}{2}(S_0 - S_2) \begin{pmatrix} 1 \\ 0 \\ 0 \\ -1 \end{pmatrix} \quad \text{Eqn 17}$$

To measure the $S_3$ variations, the circular polarizer is inverted for linear operation according to $$M_{Circular\ Polarizer-Linear} = M_{\theta}M_{\varphi} = \begin{pmatrix} 1 & 0 & 1 & 0 \\ 0 & 0 & 0 & 0 \\ 1 & 0 & 1 & 0 \\ 0 & 0 & 0 & 0 \end{pmatrix} * \begin{pmatrix} 1 & 0 & 0 & 0 \\ 0 & 1 & 0 & 0 \\ 0 & 0 & 0 & -1 \\ 0 & 0 & 1 & 0 \end{pmatrix} = \begin{pmatrix} 1 & 0 & 0 & -1 \\ 0 & 0 & 0 & 0 \\ 1 & 0 & 0 & -1 \\ 0 & 0 & 0 & 0 \end{pmatrix} \frac{1}{2} * \begin{pmatrix} 1 & 0 & 0 & -1 \\ 0 & 0 & 0 & 0 \\ 1 & 0 & 0 & -1 \\ 0 & 0 & 0 & 0 \end{pmatrix} * \begin{pmatrix} S_0 \\ S_1 \\ S_2 \\ S_3 \end{pmatrix} = \frac{1}{2}(S_0 - S_3) \begin{pmatrix} 1 \\ 0 \\ 1 \\ 0 \end{pmatrix} \quad \text{Eqn 18}$$

For completely polarized light, where the degree of polarization is 100%, the Stokes relation shown with:

$$S_0^2 = S_1^2 + S_2^2 + S_3^2 \quad \text{Eqn 19}$$

May be exploited to calculate $S_3$ while only measuring $S_1$ and $S_2$ with direct photodetector measurements, where $S_2$ is calculated as the absolute value difference of intensities observed at linear +45 degrees and linear −45 degrees:

$$S_3 = \sqrt{S_0 - S_1 - S_2} \quad \text{Eqn 20}$$

For indoor environments where the fiber network is routed in conduit and protected from acoustic disturbances, it is preferred to directly observe $S_2$ as the difference in observed optical intensities at the linear +45° and −45° polarization states, with $S_3$ calculated with Eqn 19 and Eqn 20 based on the assumption that the degree of polarization (DOP) remains at 100% throughout the FOCS optical network.

For outdoor environments, where random acoustic disturbances are potentially present, the ability to discern the effects of circular birefringence as separate from linear birefringence is based on the relation:

$$S_2 = 2E_{0X}E_{0Y}\cos\delta \quad \text{Eqn 21}$$

$$S_3 = 2E_{0X}E_{0Y}\sin\delta \quad \text{Eqn 22}$$

Where Eqn 21 and Eqn 22 show the tradeoff in the optical intensity observed for $S_2$ and $S_3$ which is dependent on the phase delay introduced by linear birefringence effects in the fiber, and where linear birefringence modulates the linear Faraday rotation observed by converting $S_2$ optical intensity to $S_3$ intensity, as the ellipticity introduced by linear birefringence effects on orthogonally polarized modes converts linearly 45 degree or linearly 135 degree polarized light into the right circular polarization state or left circular polarization state, respectively.

The invention claimed is:

1. An all fiber optic current sensor controller module, adapted to remotely interrogate an auxiliary fiber optic current sensor coil which is installed concentric with an electrical conductor, comprising:

an optical transmitter, comprised of a single mode fiber coupled distributed-feedback laser diode, with said optical transmitter connected to a module input power bus comprised of a voltage regulator chipset, with said power bus connected to an electrical energy storage device comprised of a battery, where said single mode laser transmits a continuous-wave optical reference signal which has a calibrated intensity magnitude and a calibrated center wavelength;

a fiber optic polarization generator, comprised of an all fiber linear polarizer which features a transmission axis, with an input of said generator spliced to an output of said optical transmitter, and with an output of said generator spliced to an integrated 1×2 polarization-maintaining fiber optic coupler which transmits a sample of a generated optical reference signal at a first output of said polarization maintaining 1×2 fiber coupler to a first fiber coupled photodiode, with said first photodiode connected to said power bus, and where a second output of said polarization maintaining 1×2 fiber coupler transmits said generated optical reference signal;

a module output port, which terminates said second output of said 1×2 polarization maintaining fiber coupler, where said output port is comprised of a bulkhead adapter configured to support an auxiliary patch-cord connection with said module output port;

a module input port, comprised of a bulkhead adapter configured to support an auxiliary patch-cord connection with said module input port;

a 1×4 polarization maintaining fiber optic star coupler, with an input of said star coupler connected to said module input port, and where said star coupler features four fiber optic outputs with each output featuring a respective polarization-maintaining birefringent axes;

a fiber optic polarization analyzer comprised of four all fiber linear polarizers with said all fiber linear polarizers featuring a respective transmission axis, with:

a first linear polarizer input spliced to a first polarization maintaining output of the fiber optic star coupler with a rotation angle of of 0° between said linear polarizer transmission axis and a horizontal axis of said polarization maintaining axes of said star coupler output;

a second linear polarizer input spliced to a second output of the star coupler with a rotation angle of 45° between said linear polarizer transmission axis and said horizontal axis of said polarization maintaining axes of said star coupler output;

a third linear polarizer input spliced to a third output of the star coupler with a rotation angle of 90° between said linear polarizer transmission axis and said horizontal axis of said polarization maintaining axes of said star coupler output;

a fourth linear polarizer input spliced to a fourth output of the star coupler with a rotation angle of 135° between said linear polarizer transmission axis and said horizontal axis of said polarization maintaining axes of said star coupler output:

where said analyzer transmits to a photodetector array comprising:

a second fiber coupled photodiode, connected to said module power bus, with an input spliced to an output of said first linear polarizer;

a third fiber coupled photodiode, connected to said module power bus, with an input spliced to an output of said second linear polarizer;

a fourth fiber coupled photodiode, connected to said module power bus, with an input spliced to an output of said third linear polarizer:

a fifth fiber coupled photodiode, connected to said module power bus, with an input spliced to an output of said fourth linear polarizer;

where said fiber coupled photodiodes produce a respective analog voltage output with a magnitude proportional to an incident optical intensity magnitude;

a data processing bus, comprised of a digital signal processing chipset with a plurality of single-ended analog to digital conversion inputs, where said digital signal processing chipset is connected to the module input power bus, and where a first, second, third, fourth, and fifth photodiode voltage output is connected to a respective analog to digital conversion input of said digital signal processing chipset, and where said digital signal processing chipset divides a respective difference of a third photodiode voltage output sampled value and a fifth photodiode voltage output sampled value by a respective difference of a second photodiode voltage output sampled value and a fourth photodiode voltage output sampled value to calculate an electrical current magnitude, and where said digital signal processing chipset subtracts a respective sum of said second photodiode voltage output sampled value and said fourth photodiode voltage output sampled value from a first photodiode voltage output sampled value to measure an attenuation magnitude of said optical reference signal; and, an integrated module display screen, connected to the power bus and data processing bus.

* * * * *